(12) United States Patent
Sohn

(10) Patent No.: US 10,804,219 B2
(45) Date of Patent: Oct. 13, 2020

(54) SEMICONDUCTOR DEVICE

(71) Applicant: SAMSUNG ELECTRONICS CO., LTD., Suwon-si, Gyeonggi-Do (KR)

(72) Inventor: Wan Gi Sohn, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/446,790

(22) Filed: Jun. 20, 2019

(65) Prior Publication Data
US 2020/0152584 A1 May 14, 2020

(30) Foreign Application Priority Data

Nov. 12, 2018 (KR) ........................ 10-2018-0138240

(51) Int. Cl.
 *H01L 23/00* (2006.01)
 *H01L 27/108* (2006.01)
 (Continued)

(52) U.S. Cl.
 CPC ...... *H01L 23/562* (2013.01); *H01L 21/31116* (2013.01); *H01L 21/31144* (2013.01); *H01L 21/32139* (2013.01); *H01L 23/522* (2013.01); *H01L 23/64* (2013.01); *H01L 27/10814* (2013.01); *H01L 27/10823* (2013.01); *H01L 27/10894* (2013.01); *H01L 27/10897* (2013.01);
 (Continued)

(58) Field of Classification Search
 CPC ... H01L 23/562; H01L 23/5222; H01L 23/64; H01L 27/10814; H01L 27/10894; H01L 27/10897; H01L 27/10823; H01L 28/40; H01L 28/60; H01L 28/91; H01L 29/92; H01L 21/31144; H01L 21/32139; H01L 21/3116

USPC ............... 257/532, 516, 773, 296, 300, 306, 257/E23.01, E27.016, E27.084, E27.087, 257/E27.088, E27.089, E29.001, E29.111, 257/E29.342, E29.343, E29.345, E21.001, 257/E21.008, E21.014, E21.252, E21.648, 257/E21.651; 438/243, 253, 270, 381, 438/386, 672, 702

See application file for complete search history.

(56) References Cited

U.S. PATENT DOCUMENTS 5,358,733 A 10/1994 Lur et al.
8,476,688 B2 7/2013 Cho et al.
(Continued)

FOREIGN PATENT DOCUMENTS

| JP | 2011-166071 | 8/2011 |
|---|---|---|
| JP | 2013-247138 | 12/2013 |
| KR | 10-1650843 | 8/2016 |

*Primary Examiner* — Dao H Nguyen
(74) *Attorney, Agent, or Firm* — F. Chau & Associates, LLC

(57) ABSTRACT

A semiconductor device includes a plurality of lower electrodes repeatedly arranged at a first pitch in a first direction and a second direction crossing the first direction at an acute angle on a substrate, and a support pattern in contact with sidewalls of the plurality of lower electrodes and supporting the plurality of lower electrodes. The support pattern includes a first support region having a plurality of openings penetrating the support pattern and a second support region disposed at a periphery of the first support region. The plurality of openings may continuously extend in a zigzag manner, respectively, throughout an entirety of the first support region.

20 Claims, 18 Drawing Sheets

(51) Int. Cl.
*H01L 49/02* (2006.01)
*H01L 23/64* (2006.01)
*H01L 21/311* (2006.01)
*H01L 21/3213* (2006.01)
*H01L 23/522* (2006.01)

(52) U.S. Cl.
CPC .............. *H01L 28/40* (2013.01); *H01L 28/60* (2013.01); *H01L 28/91* (2013.01); *H01L 28/92* (2013.01)

(56) References Cited

U.S. PATENT DOCUMENTS

| | | | |
|---|---|---|---|
| 8,624,354 B2 | 1/2014 | Kim et al. | |
| 8,779,549 B2 | 7/2014 | Kim et al. | |
| 9,431,403 B2 | 8/2016 | Komeda | |
| 9,647,056 B2* | 5/2017 | Yoon | H01L 28/40 |
| 10,468,415 B2* | 11/2019 | You | H01L 27/10814 |
| 2012/0049380 A1* | 3/2012 | Kim | H01L 27/10852 |
| | | | 257/773 |
| 2012/0104559 A1* | 5/2012 | Kim | H01L 28/90 |
| | | | 257/618 |
| 2012/0235279 A1* | 9/2012 | Seo | H01L 28/60 |
| | | | 257/532 |
| 2013/0228837 A1* | 9/2013 | Sukekawa | H01L 28/91 |
| | | | 257/296 |
| 2014/0015099 A1 | 1/2014 | Hwang | |
| 2014/0120683 A1* | 5/2014 | Kim | H01L 28/91 |
| | | | 438/381 |
| 2016/0343716 A1 | 11/2016 | Seo | |

\* cited by examiner

SEMICONDUCTOR DEVICE

CROSS-REFERENCE TO RELATED APPLICATION(S)

This application claims priority under 35 U.S.C. § 119 to Korean Patent Application No. 10-2018-0138240, filed on Nov. 12, 2018, in the Korean Intellectual Property Office, the disclosure of which is herein incorporated by reference in its entirety.

TECHNICAL FIELD

The present inventive concept relates to a semiconductor device.

DISCUSSION OF RELATED ART

To meet the demand for smaller and higher-performance electronic devices, significant research for reducing the size of elements constituting semiconductor devices such as dynamic random access memory (DRAM) and static random access memory (SRAM) devices, and enhancing performance thereof is being conducted. In DRAM, research for forming reliable and stable cell capacitors with reduced size is being conducted.

SUMMARY

Example embodiments of the present inventive concept provide a semiconductor device in which conductive pillars having high aspect ratio may be formed to be structurally stable.

According to an example embodiment of the present inventive concept, a semiconductor device includes: a plurality of lower electrodes repeatedly arranged at a first pitch in a first direction and a second direction crossing the first direction at an acute angle on a substrate; and a support pattern in contact with sidewalls of the plurality of lower electrodes and supporting the plurality of lower electrodes. The support pattern includes a first support region having a plurality of openings penetrating the support pattern and a second support region disposed along a periphery of the first support region. The plurality of openings may extend continuously in a zigzag manner throughout an entirety of the first support region.

According to an example embodiment of the present inventive concept, a semiconductor device includes: a plurality of conductive pillars repeatedly arranged at a first pitch in a first direction and a second direction crossing the first direction on a substrate; and a support pattern in contact with sidewalls of the plurality of conductive pillars and supporting the plurality of conductive pillars. The support pattern includes a first support region having a plurality of openings penetrating the support pattern and a second support region disposed along a periphery of the first support region. The plurality of openings may extend continuously in a zigzag manner throughout an entirety of the first support region, respectively, and may be repeatedly arranged at a second pitch, which is twice the first pitch.

According to an example embodiment of the present inventive concept, a semiconductor device includes: a plurality of conductive pillars repeatedly arranged on a substrate at a first pitch in a first direction and a second direction crossing the first direction at an acute angle on a substrate; and a support pattern in contact with sidewalls of the plurality of conductive pillars and supporting the plurality of conductive pillars. The support pattern includes a first support region having a plurality of openings penetrating the support pattern and a second support region disposed along a periphery of the first support region. The plurality of openings extend continuously throughout an entirety of the first support region, and include a first extending portion and a second extending portion extending in different directions and alternately arranged. A portion in which the first extending portion and the second extending portion meet each other may be spaced apart from the plurality of conductive pillars.

BRIEF DESCRIPTION OF THE DRAWINGS

The above and other aspects and features of the present inventive concept will be more clearly understood from the following detailed description, taken in conjunction with the accompanying drawings, in which.

Figure 1:
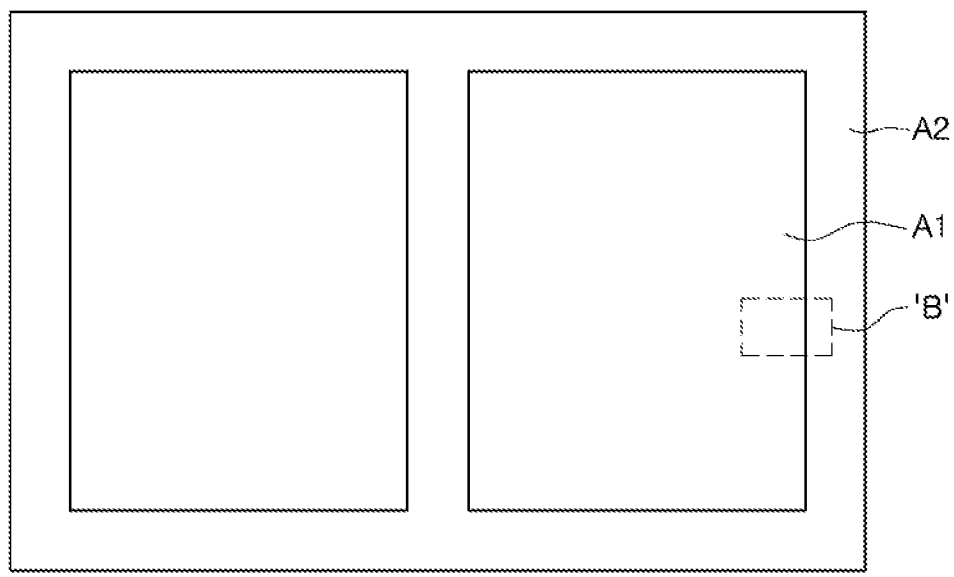
FIG. 1 is a plan view illustrating a semiconductor device according to an example embodiment of the present inventive concept.

Since the drawings in FIGS. 1-18 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, example embodiments of the present inventive concept will be described with reference to the accompanying drawings.

Figure 2:
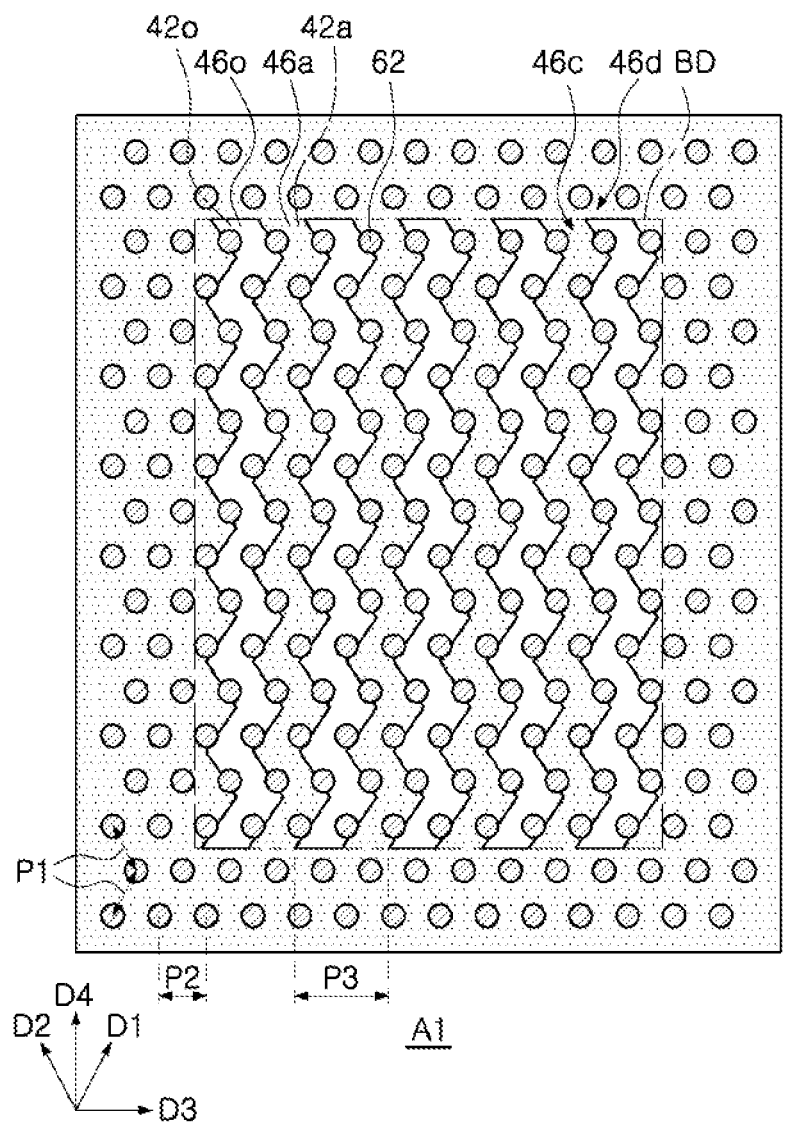
FIG. 2 is a plan view illustrating a dispositional structure of conductive pillars and support patterns of a semiconductor device according to an example embodiment of the present inventive concept.

FIG. 1 is a plan view illustrating a semiconductor device according to an example embodiment of the present inventive concept. FIG. 2 is a plan view for explaining an arrangement of conductive pillars and support patterns of a semiconductor device according to an example embodiment of the present inventive concept.

Referring to FIGS. 1 and 2, a semiconductor device according to an example embodiment of the present inventive concept may include a first region A1 and a second region A2 disposed around the first region A1. The first region A1 may be, for example, a memory cell array region of a dynamic random access memory (DRAM), and the second region A2 may be a peripheral circuit region. In the first region A1, cell transistors and cell capacitors of DRAM may be disposed. In the second region A2, peripheral transistors may be disposed.

Conductive pillars 62 disposed in the first region A1 may be repeatedly aligned in a first direction (D1 direction) and a second direction (D2 direction). The conductive pillars 62 may be disposed to be spaced apart from each other by an interval of a first pitch P in the first direction (D1 direction), and may be disposed to be spaced apart from each other by an interval of the first pitch P1 in the second direction (D2 direction). The conductive pillars 62 may be disposed to be spaced apart from each other by an interval of a second pitch P2 in a third direction (D3 direction) different from the first direction (D1 direction) and the second direction (D2 direction). The first direction (D1 direction), the second direction (D2 direction) and the third direction (D3 direction) may be directions on the same plan. In an example embodiment of the present inventive concept, the first pitch P1 and the second pitch P2 may be the same. The pitch may be defined as a distance between centers of adjacent conductive pillars 62. An angle formed by the first direction (D1 direction) and the second direction (D2 direction) may be a predetermined first acute angle, and an angle formed by the first direction (D1 direction) and the third direction (D3 direction) may be a predetermined second acute angle. Here, the angle in the case where "an angle formed by a specific direction and another specific direction" means a small angle among the two angles generated by the intersection of the two directions, i.e., the one being an acute angle. In an example embodiment of the present inventive concept, the first acute angle and the second acute angle may be the same. In an example embodiment of the present inventive concept, the first acute angle and the second acute angle may both be 60°. However, the present inventive concept is not limited thereto, and first acute angle and the second acute angle may be formed of various angles.

An upper support pattern 46a may be in a plate shape including upper openings 46o, and may include an inner support region 46c and an outer support region 46d disposed along a periphery of the inner support region 46c. The inner support region 46c and the outer support region 46d may be separated, for example, by a boundary BD. The inner support region 46c may be a region formed at a central portion of the first region A1. For example, the outer support region 46d may be disposed more adjacent to the second region A2 as compared to the inner support region 46c, and is interposed between the inner support region 46c and the second region A2. The shape of the inner support region 46c is shown as a rectangle shape in FIG. 2 as an example, but the present inventive concept is not limited thereto. For example, any suitable shape may be used for the inner support region 46c such as, for example, a square shape, a rhombus, or a trapezoid shape. To increase the structural stability of the upper support pattern 46a, the upper openings 46o may be formed only in the inner support region 46c of the upper support pattern 46a, and might not be formed in the outer support region 46d of the upper support pattern 46a. The openings 46o penetrating the upper support pattern 46a may continuously extend in a zigzag manner over the entirety of the inner support region 46c. The openings 46o may extend to the same length from one side of the inner support region 46c to the other side of the inner support region 46c. The upper openings 46o may be repeatedly arranged at a third pitch P3, which is larger than the first pitch P1 and the second pitch P2, in the third direction (D3 direction). In an example embodiment of the present inventive concept, the third pitch P3 may be twice the second pitch P2. When the first pitch P1 and the second pitch P2 are the same, the third pitch P3 may be twice the first pitch P1.

The plurality of upper openings 46o may partially be in contact with sidewalls of all the plurality of conductive pillars 62 in the inner support region 46c. For example, part of the sidewall of each of the plurality of conductive pillars 62 may be exposed by the upper opening 46o. All the plurality of conductive pillars 62 in the inner support region 46c may be vertically overlapped with a rim of the upper openings 46o.

The conductive pillars 62 penetrating the outer support region 46d of the upper support pattern 46a in which upper openings 46o are not formed may be additionally formed as dummies. For example, the conductive pillars 62 formed in the outer support region 46d of the upper support pattern 46a may be conductive pillars 62 that are formed for the uniformity of the conductive pillars 62 formed in the first region A1, without functioning as lower electrodes or storage nodes of the DRAM cell capacitors to be described below. When the conductive pillars 62 are lower electrodes of cell capacitors, cells including these conductive pillars 62 penetrating the outer support region 46d may be dummy cells. In addition, a region of the semiconductor device in which the dummy cells are located may be defined as a dummy region, and a region of the semiconductor device in which active memory cells are located may be defined as a cell region. In this case, the dummy region may be disposed to surround the rim of the cell region.

A lower support pattern 42a may have a lower opening 42o, which vertically overlaps the upper opening 46o of the upper support pattern 46a. (Referring to FIG. 4).

Figure 4:
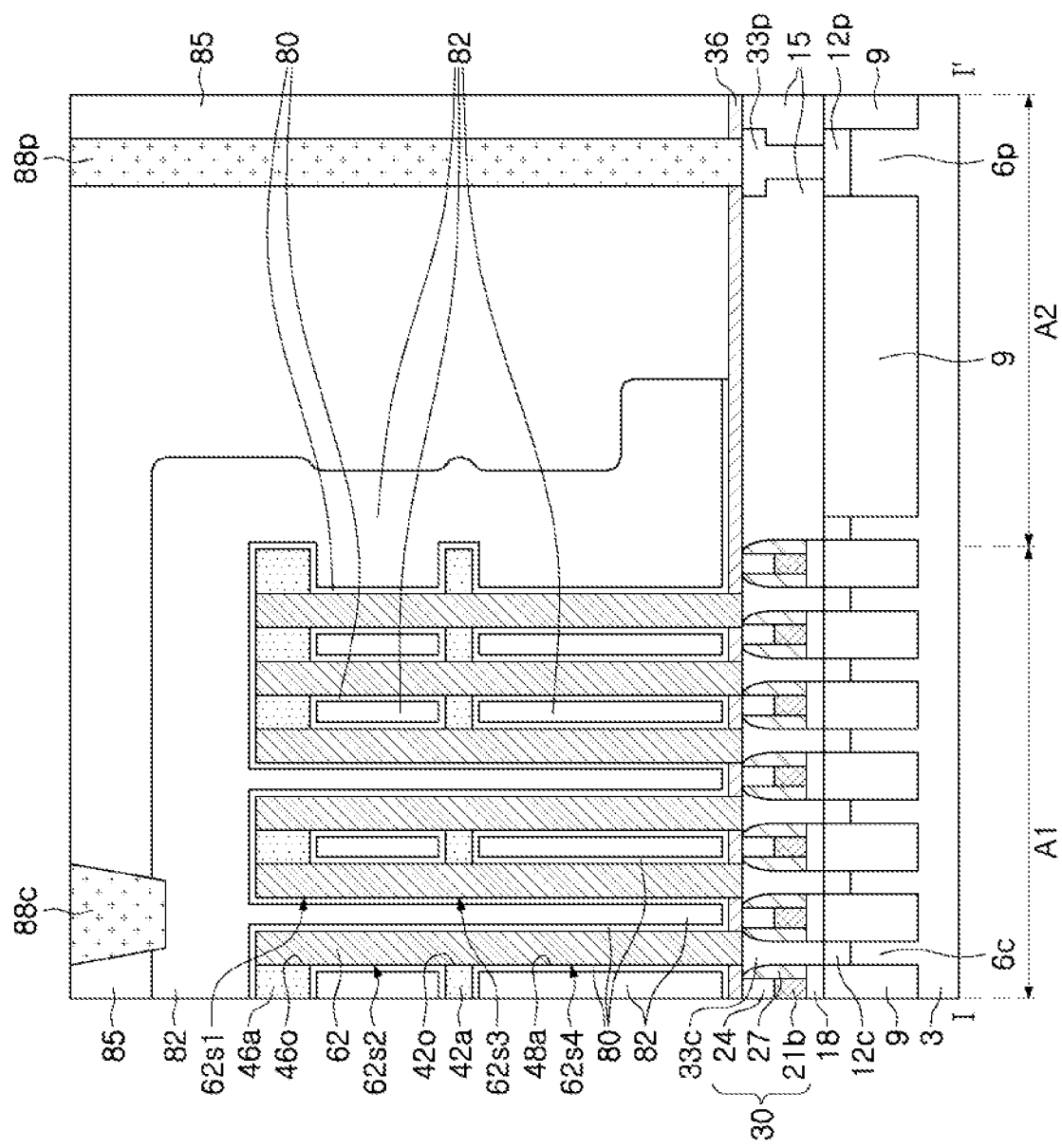
FIG. 4 is a cross-sectional view illustrating a portion of a semiconductor device according to an example embodiment of the present inventive concept.

The lower and upper support patterns 42a and 46a may prevent the columnar conductive pillars 62 from collapsing, and also may prevent the conductive pillars 62 from being deformed and being in contact with each other due to non-uniform deposition of a subsequent dielectric layer (80 of FIG. 4). For example, the lower and upper support patterns 42a and 46a may be disposed between, mutually connect and support the outer walls of the adjacent conductive pillars 62. The lower and upper support patterns 42a and 46a may be formed of silicon nitride ($Si_3N_4$) or silicon carbonitride (SiCN).

Figure 3:
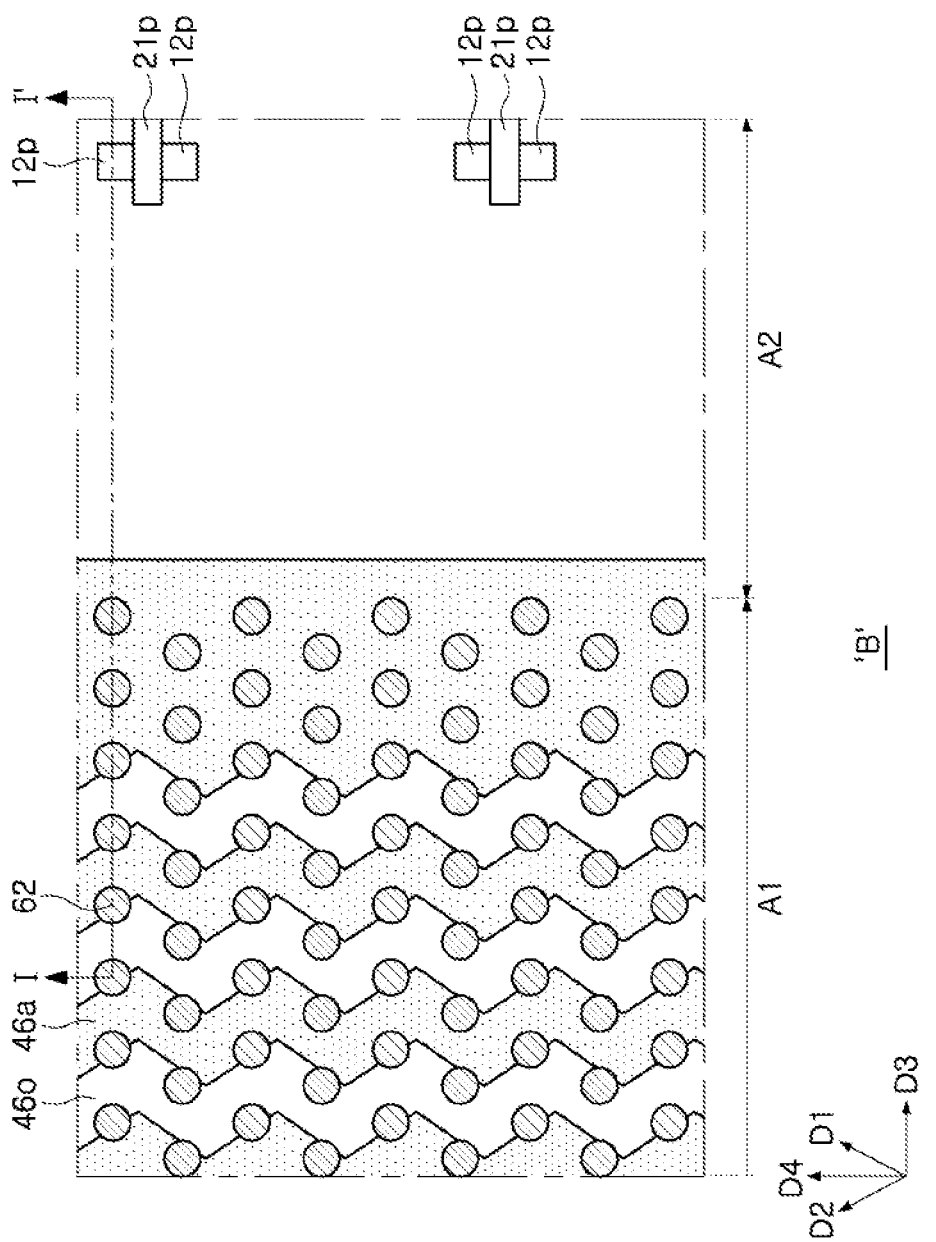
FIG. 3 is a partial enlarged view of a region indicated by 'B' of FIG. 1.

FIG. 3 is a partial enlarged view of a region indicated by 'B' of FIG. 1. FIG. 4 is a cross-sectional view illustrating a portion of a semiconductor device according to an example embodiment of the present inventive concept, and is a cross-sectional view taken along line I-I of FIG. 3.

Referring to FIGS. 3 and 4, the semiconductor device may include bit line structures 30, cell contact plugs 33c, conductive pillars 62, a dielectric layer 80, an electrode layer 82, a lower support pattern 42a, and an upper support pattern 46a on a substrate 3.

The substrate 3 may be formed of, for example, a silicon (Si) substrate, a silicon on insulator (SOI) substrate, a silicon germanium (SiGe) substrate, a gallium arsenide (GaAs) substrate, a ceramic substrate, a quartz substrate, a glass substrate for display, or the like. For example, the substrate 3 may be silicon (Si) substrate doped with impurities. For example, various kinds of active devices or passive devices may be formed on the substrate 3. The active devices may be, for example, cell transistors of a DRAM, and particularly, cell transistors of a DRAM having, a $6F^2$ or $4F^2$ unit cell size. However, the present inventive concept is not limited thereto. Here, 1F means a minimum feature size.

A device isolation region 9, to define cell active regions 6c and peripheral active regions 6p may be formed on the substrate 3. The device isolation region 9 may include silicon oxide ($SiO_2$) or a silicon oxide-based insulating material. First impurity regions 12c may be formed in upper portions of the cell active regions 6c, and a second impurity region 12p may be formed in an upper portion of the peripheral active region 6p. Each of the first impurity regions 12c may be a source or a drain of a cell transistor formed in the first region A1. The cell transistor may be, for example, a buried gate cell array transistor (BCAT) having a buried gate electrode. The second impurity region 12p may be a source or a drain of a peripheral transistor formed in the second region A2.

Bit line structures 30 may be formed on the first region A1 of the substrate 3. The bit line structures 30 may be formed on an insulating layer 18 on the substrate 3. The bit line structures 30 may include bit lines 21b and bit line capping layers 24, which are sequentially stacked, and may include bit line spacers 27 formed on side surfaces of the bit lines 21b and the bit line capping layers 24. Gate electrodes 21p (referring to FIG. 3) may be formed on the second region A2 of the substrate 3. The bit lines 21b and the gate electrodes 21p may be formed of a conductive material. For example, the bit lines 21b and the gate electrodes 21p may each independently include at least one of, for example, polycrystalline silicon, a metal silicide compound, a conductive metal nitride and a metal, but the present inventive concept is not limited thereto. The bit line capping layers 24 may be formed of an insulating material such as silicon nitride ($Si_3N_4$), or the like. The bit line spacers 27 may be formed of an insulating material such as silicon nitride ($Si_3N_4$), or the like. Cell contact plugs 33c electrically connected to the first impurity regions 12c may be formed between the bit line structures 30. For example, the cell contact plugs 33c may be storage node contacts. Capacitors may be electrically connected to the storage node contacts, i.e., the cell contact plugs 33c. An interlayer insulating layer 15 may be formed on the second region A2 of the substrate 3. The interlayer insulating layer 15 may be formed of silicon oxide ($SiO_2$). A peripheral contact plug 33p penetrating the interlayer insulating layer 15 and electrically connected to the second impurity region 12p may be formed. The cell contact plugs 33c and the peripheral contact plug 33p may include a conductive material, and may each independently include at least one of, for example, polycrystalline silicon, a metal silicide compound, a conductive metal nitride, and a metal, but the present inventive concept is not limited thereto.

An etch stop layer 36 may be formed on the bit line structures 30 and the interlayer insulating layer 15. Conductive pillars 62 penetrating the etch stop layer 36 and electrically connected to the cell contact plugs 33c may be formed. The conductive pillars 62 may have a column shape extending in a direction perpendicular to the upper surface of the substrate 3. For example, the extending direction of the conductive pillars 62 may be perpendicular to the first direction (D1 direction), the second direction (D2 direction) and the third direction (D3 direction). The conductive pillars 62 may include a conductive material such as, for example, a metal, a metal nitride, a metal oxide, a metal silicide, a conductive carbon, or a combination thereof. The conductive pillars 62 may include, for example, titanium (Ti), titanium nitride (TiN), titanium aluminum nitride (TiAlN), titanium carbonitride (TiCN), tantalum (Ta), tantalum nitride (TaN), tantalum aluminum nitride (TaAlN), tantalum carbonitride (TaCN), ruthenium (Ru), platinum (Pt), or a combination thereof.

A lower support pattern 42a and an upper support pattern 46a, supporting the conductive pillars 62 and disposed to be spaced apart from each other may be formed. Accordingly, the lower support pattern 42a may be more adjacent to the substrate 3 than upper support pattern 46a. The lower support pattern 42a may have lower openings 42o, and the upper support pattern 46a may have upper openings 46o. The lower openings 42o and the upper openings 46o may be vertically overlapped.

A dielectric layer 80 covering sidewalls of the conductive pillars 62 may be formed, and an electrode layer 82 covering the conductive pillars 62 and the lower and upper support patterns 42a and 46a may be formed on the dielectric layer 80. The dielectric layer 80 may include, for example, a high-k dielectric, silicon oxide ($SiO_2$), silicon nitride ($Si_3N_4$), silicon oxynitride (SiON), or a combination thereof. The high-k dielectric may include at least one of, for example, hafnium oxide ($HfO_2$), hafnium silicon oxide ($HfSiO_4$), lanthanum oxide ($La_2O_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc, Ta)O_3$), or lead zinc niobate ($Pb(Zn_{1/3}Nb_{2/3})O_3$). The electrode layer 82 may include, for example, a metal, a metal nitride, a conductive carbon, a conductive semiconductor compound, or a combination thereof. The semiconductor compound may include a doped silicon germanium (SiGe) material.

The electrode layer 82, the dielectric layer 80, and the conductive pillars 62 may constitute DRAM cell capacitors. For example, the conductive pillars 62 may be lower electrodes or storage nodes of the DRAM cell capacitors, and the electrode layer 82 may be an upper electrode or a plate electrode of the DRAM cell capacitors. The dielectric layer 80 may be interposed between the electrode layer 82 and the conductive pillars 62. Also, the dielectric layer 80 may be interposed between the electrode layer 82 and one of the upper support pattern 46a, the lower support pattern 42a and the etch stop layer 36. The dielectric layer 80 may be made up of a single layer or a plurality of layers.

A planarized intermetal insulating layer 85 may be formed on the substrate 3 having the electrode layer 82. A first contact plug 88c penetrating the intermetal insulating layer 85 and electrically connected to the electrode layer 82 in the first region A1, and a second contact plug 88p penetrating the intermetal insulating layer 85 and the etch stop layer 36 and electrically connected to the peripheral contact plug 33p in the second region A2 may be formed.

FIGS. 5 to 9 are plan views each illustrating one aspect of a support pattern of a semiconductor device according to an example embodiment of the present inventive concept.

Figure 5:
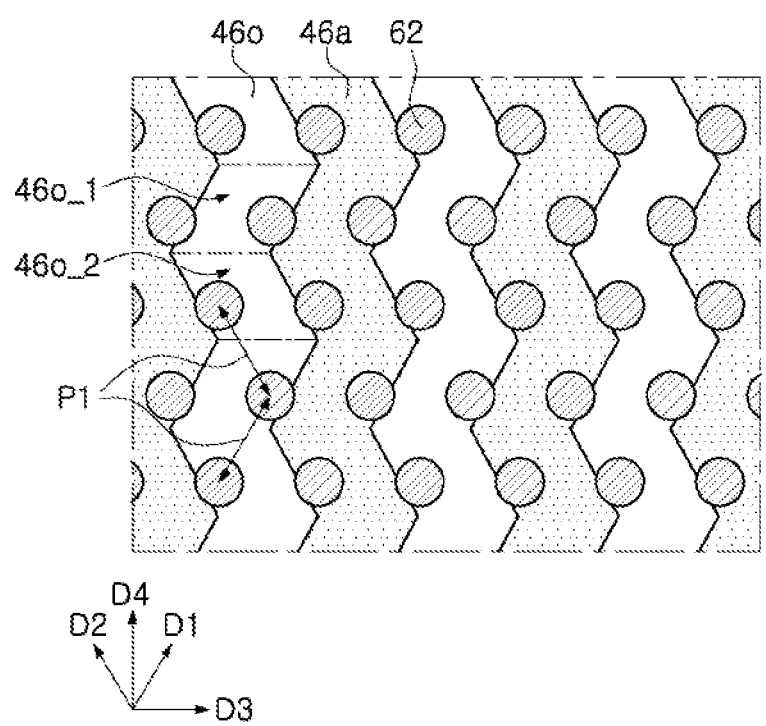
FIGS. 5 to 9 are plan views each illustrating one aspect of a support pattern of a semiconductor device according to an example embodiment of the present inventive concept.

Referring to FIG. 5, the upper openings 46o may be bent at every length corresponding to the first pitch P1. For example, the upper openings 46o may include first extending portions 46o_1 extending in the first direction (D1 direction) and second extending portions 46o_2 extending in the second direction (D2 direction). The first extending portions 46o_1 and the second extending portions 46o_2 may have a length corresponding to the first pitch P1 in the first direction (D1 direction) and the second direction (D2 direction), respectively. The first extending portion 46o_1 and the second extending portion 46o_2 may be alternately disposed repeatedly. For example, the openings 46o may extend continuously and alternately in the first direction (D1 direction) and the second direction (D2 direction) in a zigzag manner along a fourth direction (D4 direction) over the entirety of the inner support region 46c. An angle at which the upper openings 46o are bent may be equal to a value obtained by subtracting an acute angle formed by the first direction (D1 direction) and the second direction (D2 direction) from 180 degrees.

Bent portions of the upper openings 46o may be spaced apart from the conductive pillars 62. For example, portions in which the first extending portion 46o_1 and the second extending portion 46o_2 meet may be spaced apart from the conductive pillars 62.

The bent portions of the upper openings 46o may be spaced apart from the conductive pillars 62, such that the upper support patterns 46a may prevent the columnar conductive pillars 62 from collapsing, and also may prevent the conductive pillars 62 from being deformed and being in contact with each other due to non-uniform deposition of a subsequent dielectric layer (80 of FIG. 4). The upper support patterns 46a may be formed of Si$_3$N$_4$ or SiCN. The deformation of the conductive pillars 62 may be caused by the stress created due to the application of the dielectric layer 80. When the bent portions of the upper openings 46o are spaced apart from the conductive pillars 62, the deformation or collapsing of the conductive pillars 62 may be prevented by dispersing the created stress.

Figure 6:
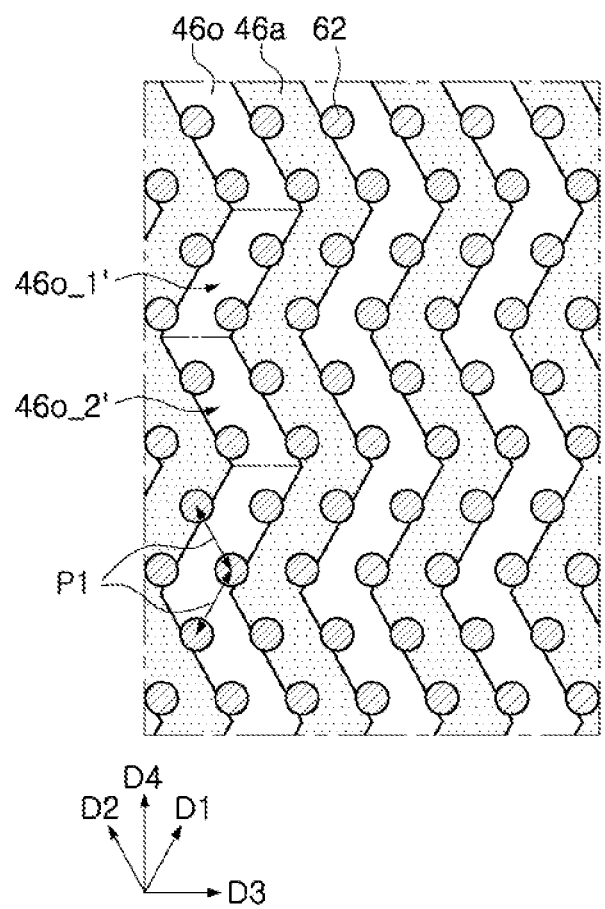
Figure 7:
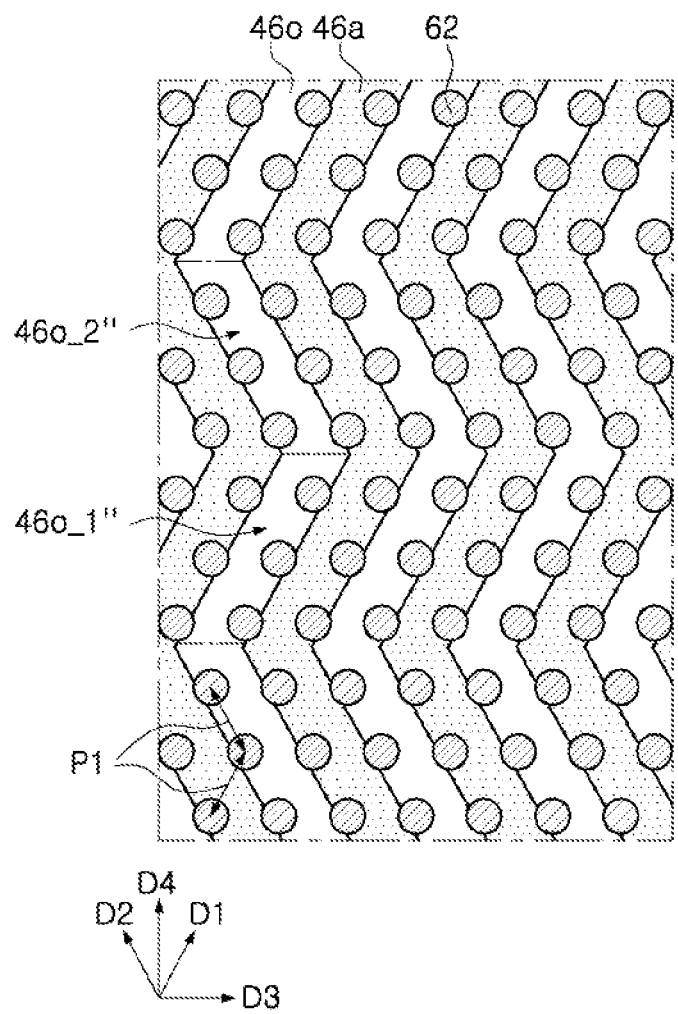

The upper openings 46o illustrated in FIGS. 6 and 7 have the same angle at which the upper openings 46o are bent as compared with FIG. 5.

The upper openings 46o of the semiconductor device may be bent at every N times of the first pitch P1, and the N may be a natural number of 2 or more.

Referring to FIG. 6, the upper openings 46o may be bent every two times of the first pitch P1. The bent portions of the upper openings 46o may be spaced apart from the conductive pillars 62, such that the upper support patterns 46a may prevent the columnar conductive pillars 62 from collapsing, and also may prevent the conductive pillars 62 from being deformed and being in contact with each other due to non-uniform deposition of a subsequent dielectric layer (80 of FIG. 4). The upper openings 46o may include first extending portions 46o 1' extending in the first direction (D1 direction) and second extending portions 46o_2' extending in the second direction (D2 direction). The number of the conductive pillars 62, in contact with the first extending portions 46o_1' or the second extending portions 46o_2' may be doubled, as compared with FIG. 5. The two conductive pillars 62, in contact with the first extending portions 46o_1' and adjacent to each other in the first direction (D1 direction) may have contact areas with the upper support pattern 46a the same as each other. The two conductive pillars 62, in contact with the second extending portions 46o_2' and adjacent to each other in the second direction (D2 direction) may have contact areas with the upper support pattern 46a the same as each other.

Referring to FIG. 7, the upper openings 46o may be bent every three times of the first pitch P1. The bent portions of the upper openings 46o may be spaced apart from the conductive pillars 62, such that the upper support patterns 46a may prevent the columnar conductive pillars 62 from collapsing, and also may prevent the conductive pillars 62 from being deformed and being in contact with each other due to non-uniform deposition of a subsequent dielectric layer (80 of FIG. 4). The upper openings 46o may include first extending portions 46o_1" extending in the first direction (D1 direction) and second extending portions 46o_2" extending in the second direction (D2 direction). The number of the conductive pillars 62, in contact with the first extending portions 46o_1" or the second extending portions 46o_2" may be tripled, as compared with FIG. 5. The three conductive pillars 62, in contact with the first extending portions 46o_1" and adjacent to each other in the first direction (D1 direction) may have contact areas with the upper support pattern 46a the same as each other. The three conductive pillars 62, in contact with the second extending portions 46o_2" and adjacent to each other in the second direction (D2 direction) may have contact areas with the upper support pattern 46a the same as each other.

Figure 8:
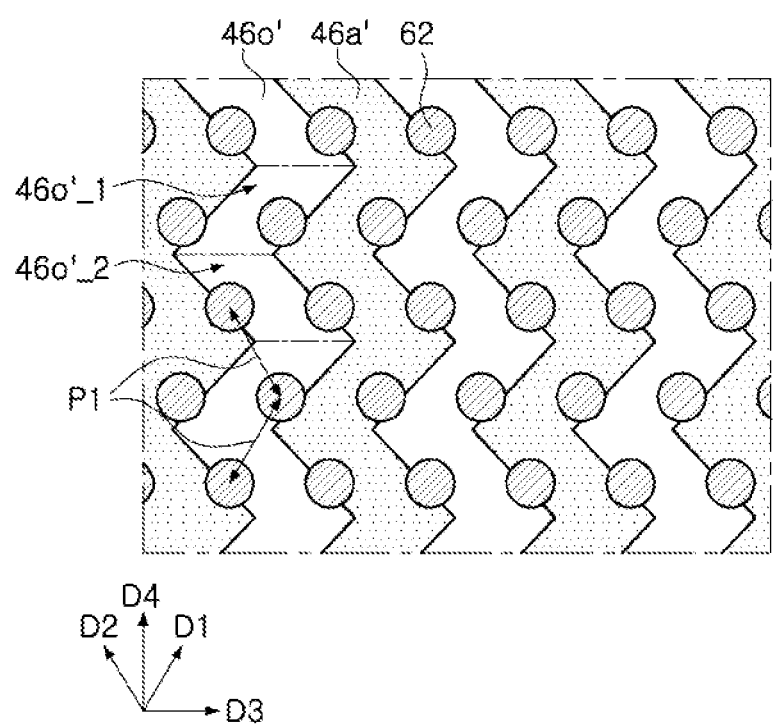

Referring to FIG. 8, an angle at which the upper openings 46o' are bent may be smaller than that of FIG. 5. The bent portions of the upper openings 46o' may be spaced apart from the conductive pillars 62, such that the upper support patterns 46a' may prevent the columnar conductive pillars 62 from collapsing, and also may prevent the conductive pillars 62 from being deformed and being in contact with each other due to non-uniform deposition of a subsequent dielectric layer (80 of FIG. 4). The angle at which the upper openings 46o' are bent may be smaller than a value obtained by subtracting an acute angle by the first direction (D1 direction) and the second direction (D2 direction) from 180 degrees. A direction in which first extending portions 46o'_1 extend is different from the first direction (D1 direction), and a direction in which second extending portions 46o'_2 extend is different from the second direction (D2 direction). The first extending portions 46o'_1 and the second extending portions 46o'_2 may have a length longer than the first pitch P1. The conductive pillars 62 adjacent to each other in the first direction (D1 direction) or the second direction (D2 direction) may have contact areas with the upper support pattern 46a' different from each other.

Figure 9:
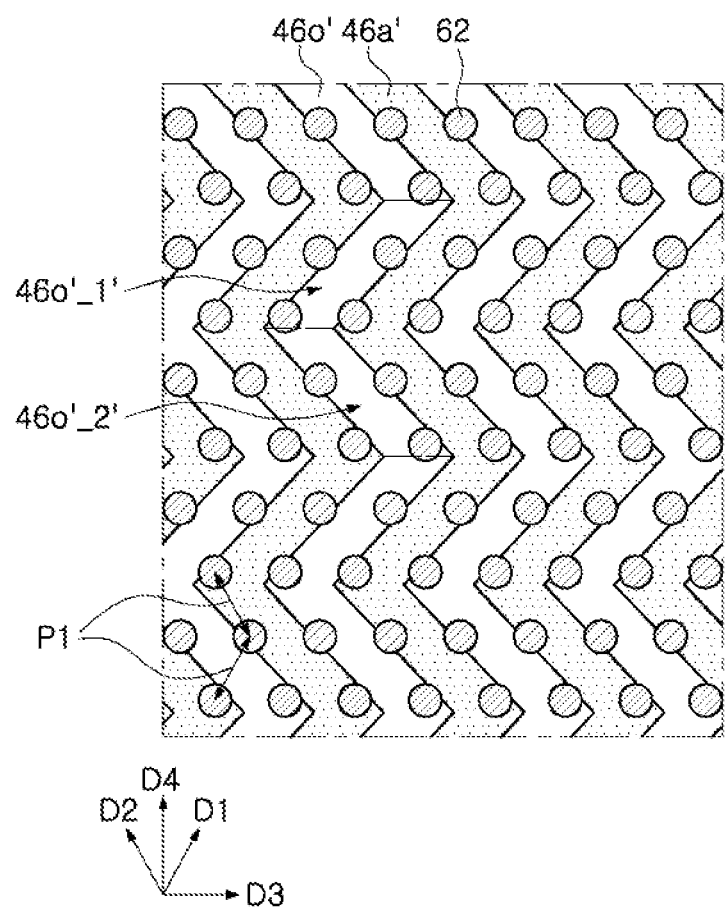

The upper openings 46o' shown in FIG. 9 is different from the upper openings 46o' shown in FIG. 8. An angle at which the upper openings 46o' are bent in FIG. 9 is the same as the angle at which the upper openings 46o' are bent in FIG. 8. The bent portions of the upper openings 46o' may be spaced apart from the conductive pillars 62, such that the upper support patterns 46a' may prevent the columnar conductive pillars 62 from collapsing, and also may prevent the conductive pillars 62 from being deformed and being in contact with each other due to non-uniform deposition of a subsequent dielectric layer (80 of FIG. 4).

Referring to FIG. 9, the number of the conductive pillars 62, in contact with the first extending portions 46o'_1' or the second extending portions 46o'_2' may be doubled, as compared with FIG. 8.

The two conductive pillars 62, in contact with the first extending portions 46o'_1' and adjacent to each other in the first direction (D1 direction) may have contact areas with the upper support pattern 46a' different from each other. The two conductive pillars 62, in contact with the second extending portions 46o'_2' and adjacent to each other in the second direction (D2 direction) may have contact areas with the upper support pattern 46a' different from each other.

FIGS. 10 to 18 are cross-sectional views illustrating a method of manufacturing a semiconductor device according to an example embodiment of the present inventive concept.

Figure 10:
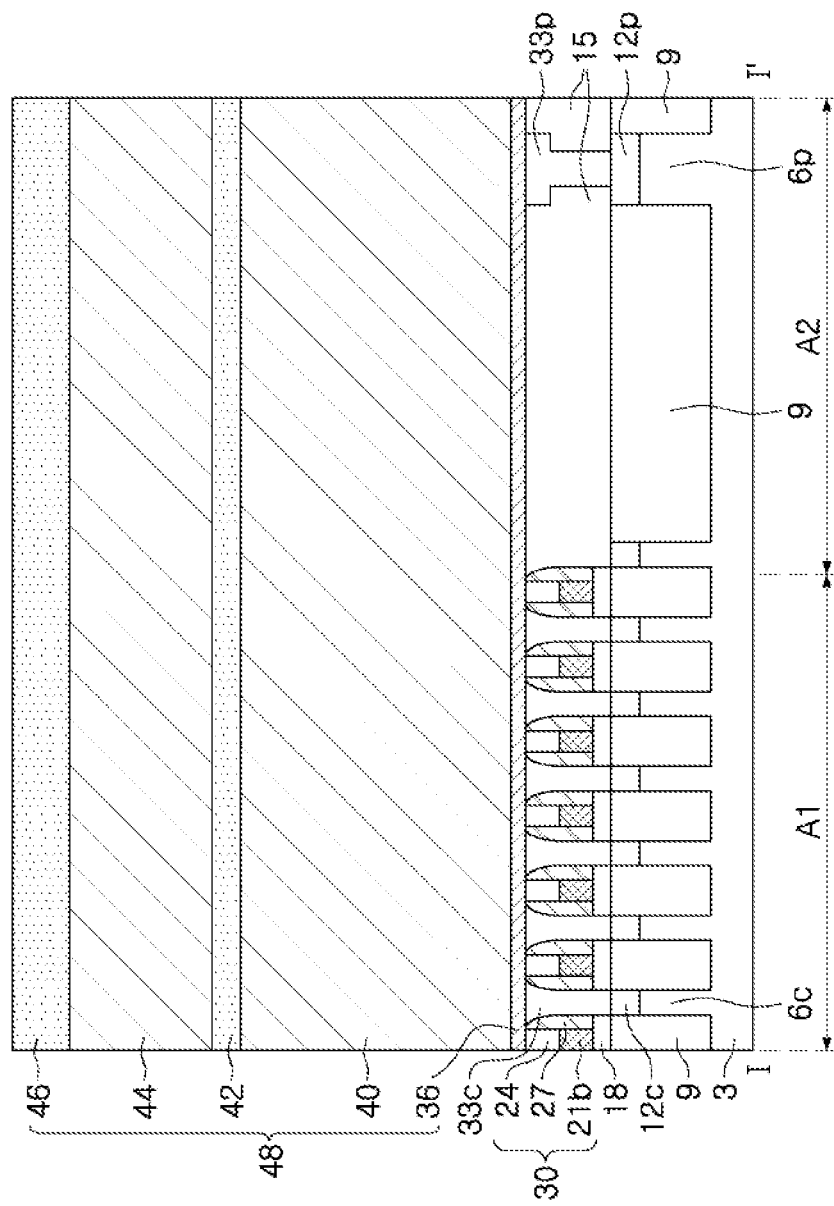
FIGS. 10 to 18 are cross-sectional views illustrating a method of manufacturing a semiconductor device according to an example embodiment of the present inventive concept.

Referring to FIG. 10, a device isolation region 9 defining cell active regions 6c and a peripheral active region 6p on a substrate 3 including a first region A1 and a second region A2 may be formed. The substrate 3 may be a semiconductor substrate. For example, the substrate 3 may be a silicon (Si) substrate.

Bit line structures 30 may be formed on the first region A1 of the substrate 3. Forming the bit line structures 30 may include forming bit lines 21b and bit line capping layers 24, which are sequentially stacked, and forming bit line spacers 27 on side surfaces of the bit lines 21b and the bit line capping layers 24. At the same time as the bit lines 21b are formed on the first region A1 of the substrate 3, gate electrodes (21p of FIG. 3) may be formed on the second region A2 of the substrate 3. The bit lines 21b and the gate electrodes 21p may be formed of a conductive material. For example, the bit lines 21b and the gate electrodes 21p may each independently include at least one of, for example, polycrystalline silicon, a metal silicide compound, a conductive metal nitride and a metal, but the present inventive concept is not limited thereto.

The bit lines 21b may be formed on the insulating layer 18 on the substrate 3. The bit line capping layers 24 may be formed of an insulating material such as silicon nitride ($Si_3N_4$), or the like. The bit line spacers 27 may be formed of an insulating material such as silicon nitride ($Si_3N_4$), or the like. An interlayer insulating layer 15 may be formed on the second region A2 of the substrate 3. The interlayer insulating layer 15 may be formed of silicon oxide ($SiO_2$). The cell contact plugs 33c disposed between the bit line structures 30 and electrically connected to the first impurity regions 12c in the cell active regions 6c may be formed. The peripheral contact plug 33p penetrating the interlayer insulating layer 15 and electrically connected to a second impurity region 12p in the peripheral active region 6p may be formed. The cell contact plugs 33c and the peripheral contact plug 33p may each independently include at least one of, for example, polycrystalline silicon, a metal silicide compound, a conductive metal nitride, and a metal, but the present inventive concept is not limited thereto.

Each of the first impurity regions 12c may be a source or a drain of a cell transistor formed in the first region A1. The second impurity region 12p may be a source or a drain of a peripheral transistor formed in the second region A2.

A mold structure 48 may be formed on the substrate 3 having the cell contact plugs 33c and the peripheral contact plug 33p. The mold structure 48 may cover the bit line structures 30, the cell contact plugs 33c, the interlayer insulating layer 15, and the peripheral contact plug 33p.

The mold structure 48 may include one or a plurality of mold layers and one or a plurality of supporting layers. For example, the mold structure 48 may include an etch stop layer 36, a lower mold layer 40 on the etch stop layer 36, a lower supporting layer 42 on the lower mold layer 40, an upper mold layer 44 on the lower supporting layer 42, and an upper supporting layer 46 on the upper mold layer 44. For example, the etch stop layer 36, the lower mold layer 40, the lower supporting layer 42, the upper mold layer 44, and the upper supporting layer 46 may be sequentially stacked on the substrate 3 having the cell contact plugs 33c and the peripheral contact plug 33p.

The lower and upper mold layers 40 and 44 may be formed of silicon oxide ($SiO_2$). The lower and upper supporting layers 42 and 46 may be formed of an insulating material having etch selectivity with respect to the material of the lower and upper mold layers 40 and 44. For example, the lower and upper supporting layers 42 and 46 may be formed of $Si_3N_4$ or SiCN. The etch stop layer 36 may be formed of an insulating material having etch selectivity with respect to the material of the lower mold layer 40. For example, the etch stop layer 36 may be formed of $Si_3N_4$ or SiCN.

In an example embodiment of the present inventive concept, the upper supporting layer 46 may be referred to as a first supporting layer, the upper mold layer 44 may be referred to as a first mold layer, the lower supporting layer 42 may be referred to as a second supporting layer, and the lower mold layer 40 may be referred to as a second mold layer.

Figure 11:
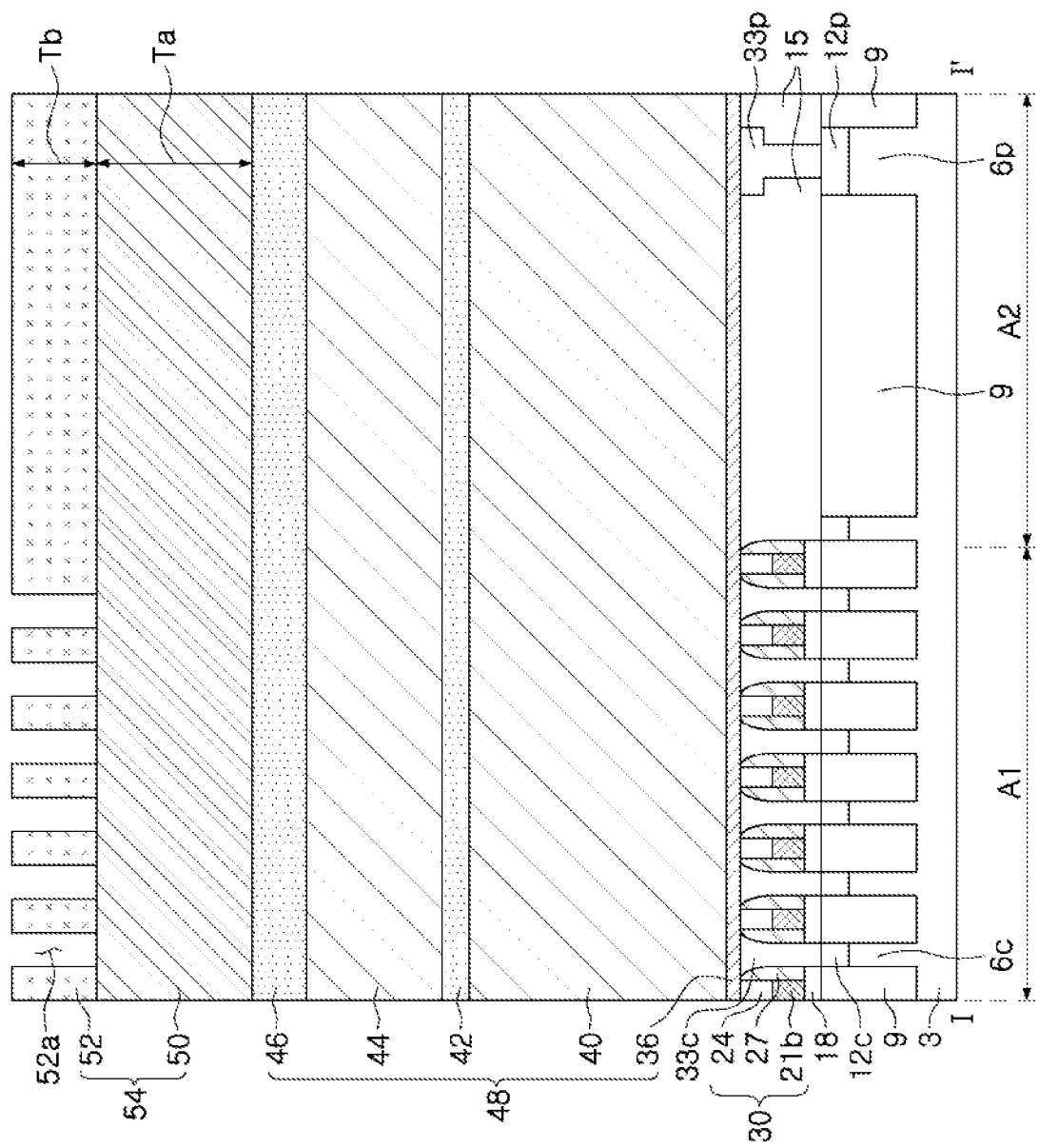

Referring to FIG. 11, a mask structure 54 may be formed on the mold structure 48.

The forming of the mask structure 54 may include forming a first mask layer 50 on the mold structure 48, and forming a second mask layer 52 on the first mask layer 50.

The first mask layer 50 may be a mask layer for patterning the mold structure 48. The first mask layer 50 may be formed of polysilicon. The second mask layer 52 may be a mask layer for patterning the first mask layer 50. The second mask layer 52 may be formed of silicon oxide ($SiO_2$) or spin on hardmask (SOH). Materials capable of forming the first and second mask layers 50 and 52, described above, are exemplary materials, and the present inventive concept is not limited thereto. For example, other suitable materials may be used to form the first and second mask layers 50 and 52.

A deposition thickness Ta of the first mask layer 50 may be greater than a deposition thickness Tb of the second mask layer 52. The second mask layer 52 may have second mask openings 52a, which expose the first mask layer 50 on the first region A1 of the substrate 3. The formation of the second mask layer 52 may go through a photolithography process to obtain a pattern to define the regions where the second mask openings 52a are formed.

Figure 12:
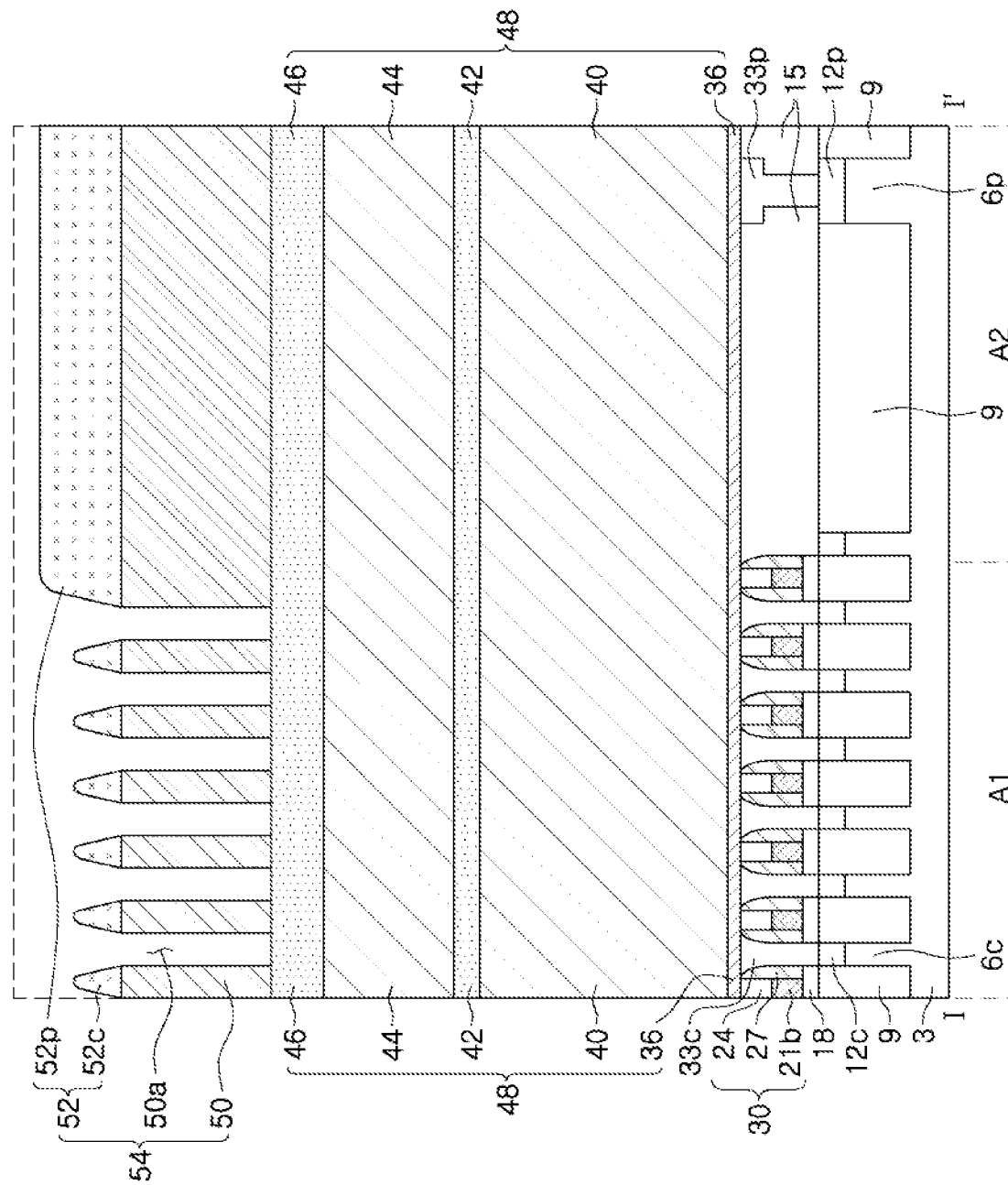

Referring to FIG. 12, in an etching process using the second mask layer 52 as an etching mask, the first mask layer 50 exposed by the second mask openings 52a may be etched, such that first mask openings 50a penetrating the first mask layer 50 and exposing the mold structure 48 may be formed.

The thickness of the second mask layer 52 may be reduced while the first mask layer 50 is etched to form the first mask openings 50a. The second mask layer 52 may have a thickness of a portion 52c located on the first region A1 of the substrate 3 smaller than that of a portion 52p located on the second region A2 of the substrate 3.

In an example embodiment of the present inventive concept, in the second mask layer 52, the portion 52c located on the first region A1 of the substrate 3 may be formed to have a narrower width toward an upper direction. For example, features of the portion 52c may have tapered sidewalls.

Figure 13:
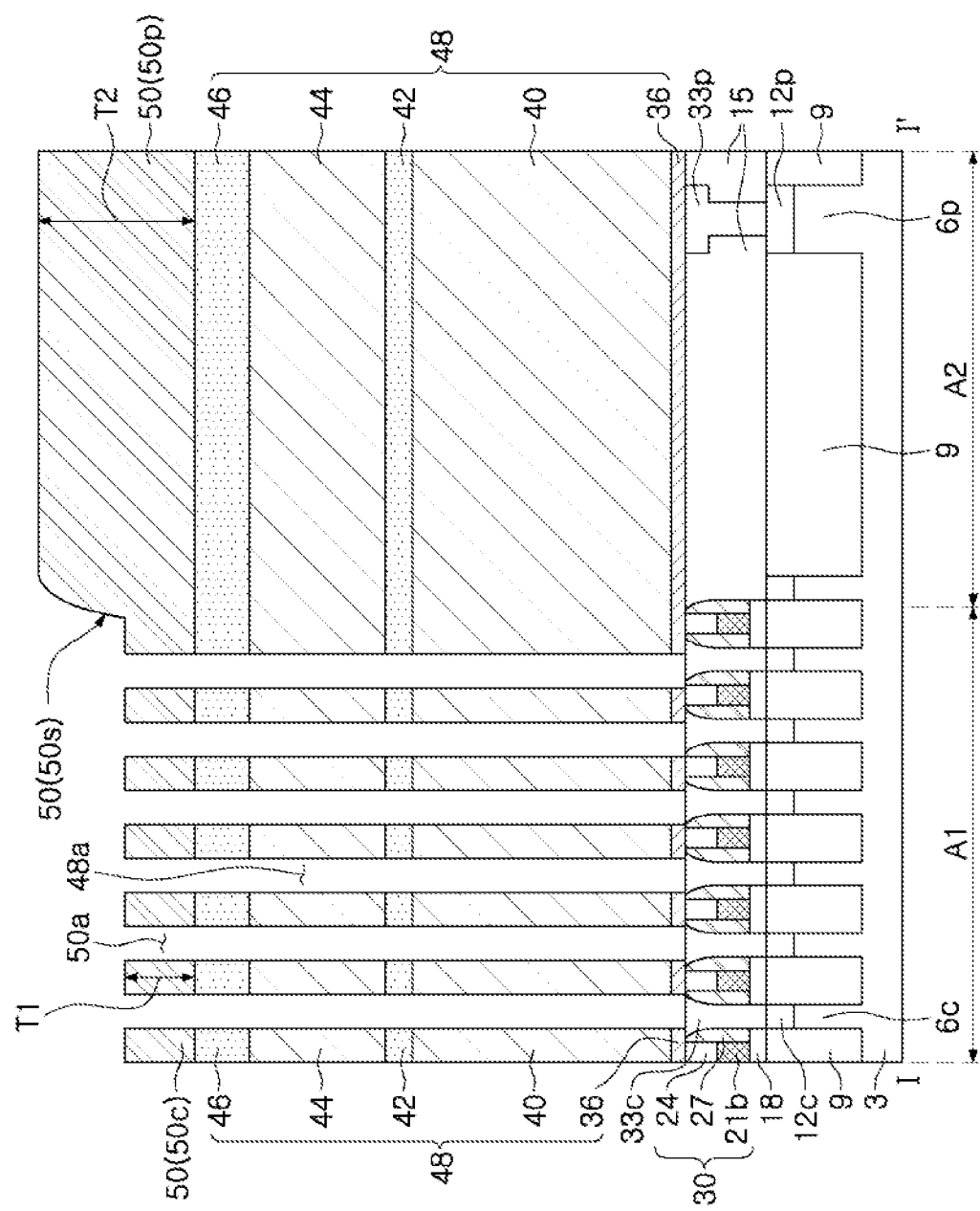

Referring to FIG. 13, in an etching process using the first mask layer 50 as an etching mask, the mold structure 48 exposed by the first mask openings 50a may be etched, such that holes 48a exposing the cell contact plugs 33c may be formed. For example, by etching the upper supporting layer 46, the upper mold layer 44, the lower supporting layer 42, the lower mold layer 40 and the etch stopper layer 36, the holes 48a may be formed in the mold structure 48. The etching process for forming the holes 48a may include, for example, at least one of a wet etching process and a dry etching process. Also, the holes 48a may be formed through several stages of etching processes.

The first mask layer 50 may be formed to have a thickness smaller than the deposition thickness Ta while forming the holes 48a. The second mask layer (52 of FIG. 12) may be removed during the etching process. The first mask layer 50 may be formed on the first region A1 of the substrate 3 at a first thickness T1, and may be formed on the second region A2 of the substrate 3 at a second thickness T2, greater than the first thickness T1. The first and second thicknesses T1 and T2 of the first mask layer 50 after forming the holes 48a may be smaller than the deposition thickness (Ta of FIG. 11) of the first mask layer 50 before forming the holes 48a.

The first mask layer 50 may include a first mask portion 50c formed with the first thickness T1 on the first region A1 of the substrate 3 and a second mask portion 50p formed with the second thickness T2 on the second region A2 of the substrate 3.

The first mask layer 50 may include an inclined portion 50s between the first mask portion 50c and the second mask portion 50p.

Figure 14:
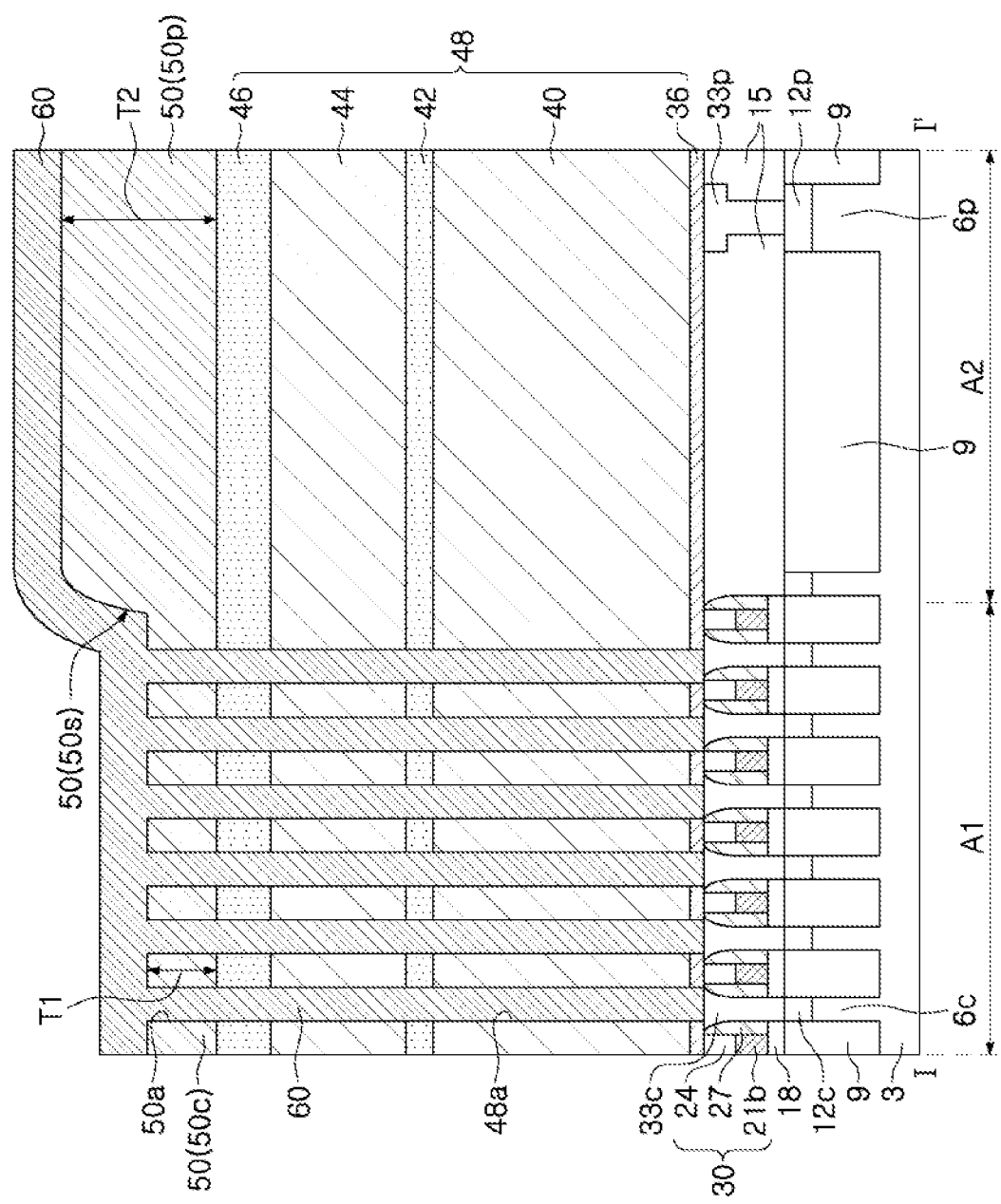

Referring to FIG. 14, a conductive material layer 60 filling the holes 48a of the mold structure 48 and the first mask openings 50a of the first mask layer 50 and covering the first mask layer 50 may be formed. The conductive material layer 60 may include a conductive material such as, for example, a metal, a metal nitride, a metal oxide, a metal silicide, a conductive carbon, or a combination thereof. For example, the conductive material layer 60 may include, for example, Ti, TiN, TiAlN, TiCN, Ta, TaN, TaAlN, TaCN, Ru, Pt, or combinations thereof.

Figure 15:
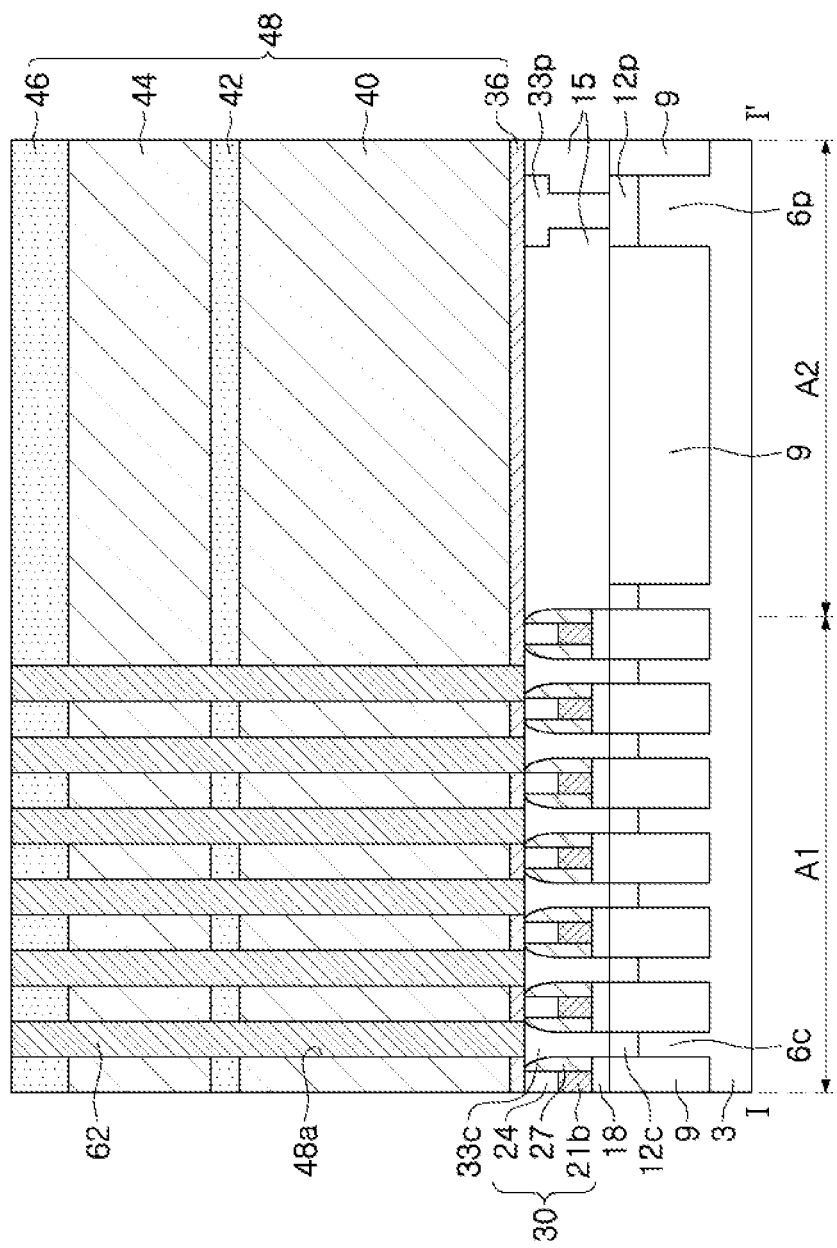

Referring to FIG. 15, a portion of the conductive material layer 60 on the first mask layer 50 may be etched. A chemical mechanical polishing (CMP) process exposing the upper supporting layer 46 may be performed, to form conductive pillars 62 remaining in the holes 48a. The CMP process may remove a part of the conductive material layer 60 and the first mask layer 50 on the upper supporting layer 46 until the upper supporting layer 46 is exposed.

Figure 16:
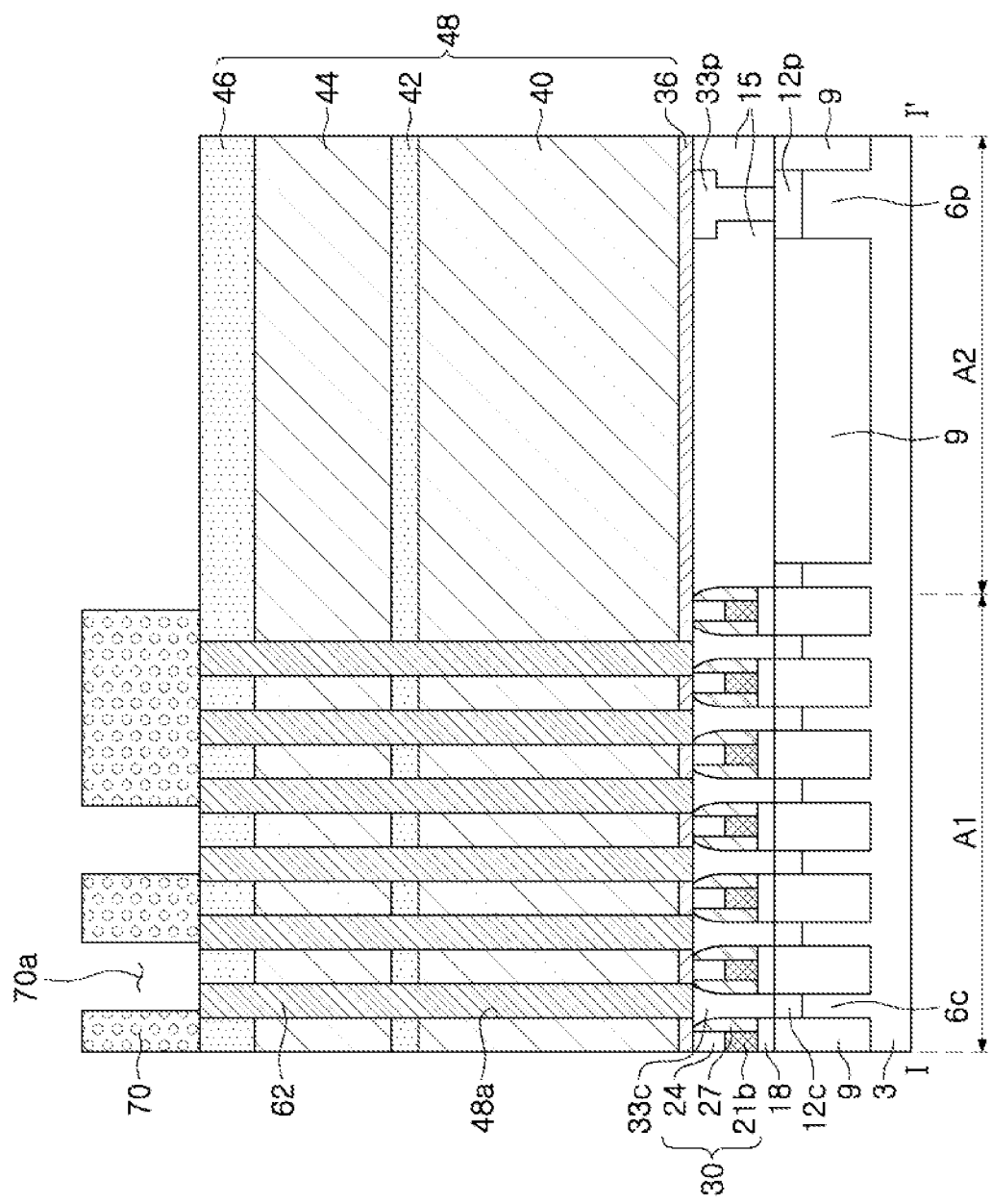
Figure 17:
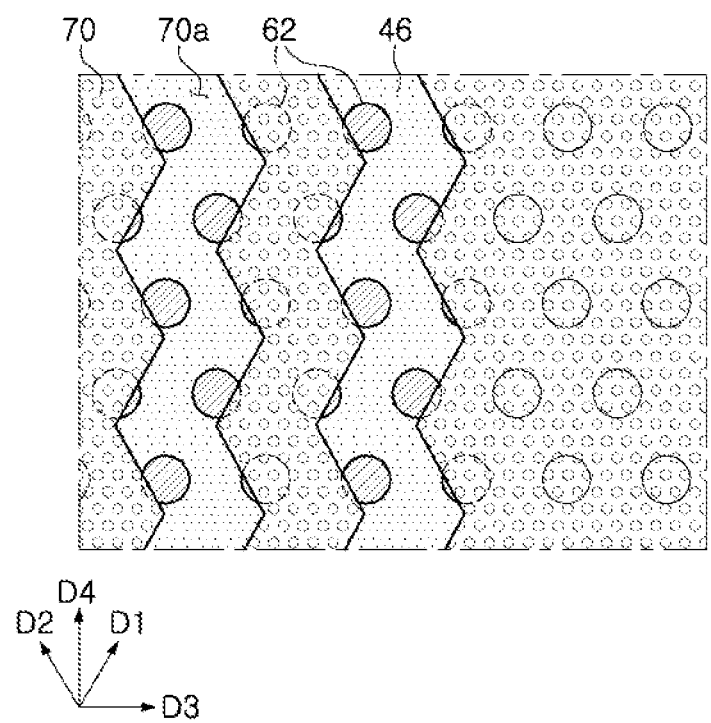

Referring to FIGS. 16 and 17, a mask 70 may be formed on the mold structure 48. The mask 70 may be a mask for forming support patterns. The mask 70 may cover a portion of the upper supporting layer 46 on the first region A1 of the substrate 3, and may include mask openings 70a. The formation of the mask 70 may go through a photolithography process and an etching process to obtain a pattern to define the regions where the mask openings 70a are formed. The mask openings 70a may extend in a zigzag manner. The mask 70 may expose a portion of the upper supporting layer 46 on the first region A1 of the substrate 3 and a portion of the conductive pillars 62 by the mask openings 70a.

Figure 18:
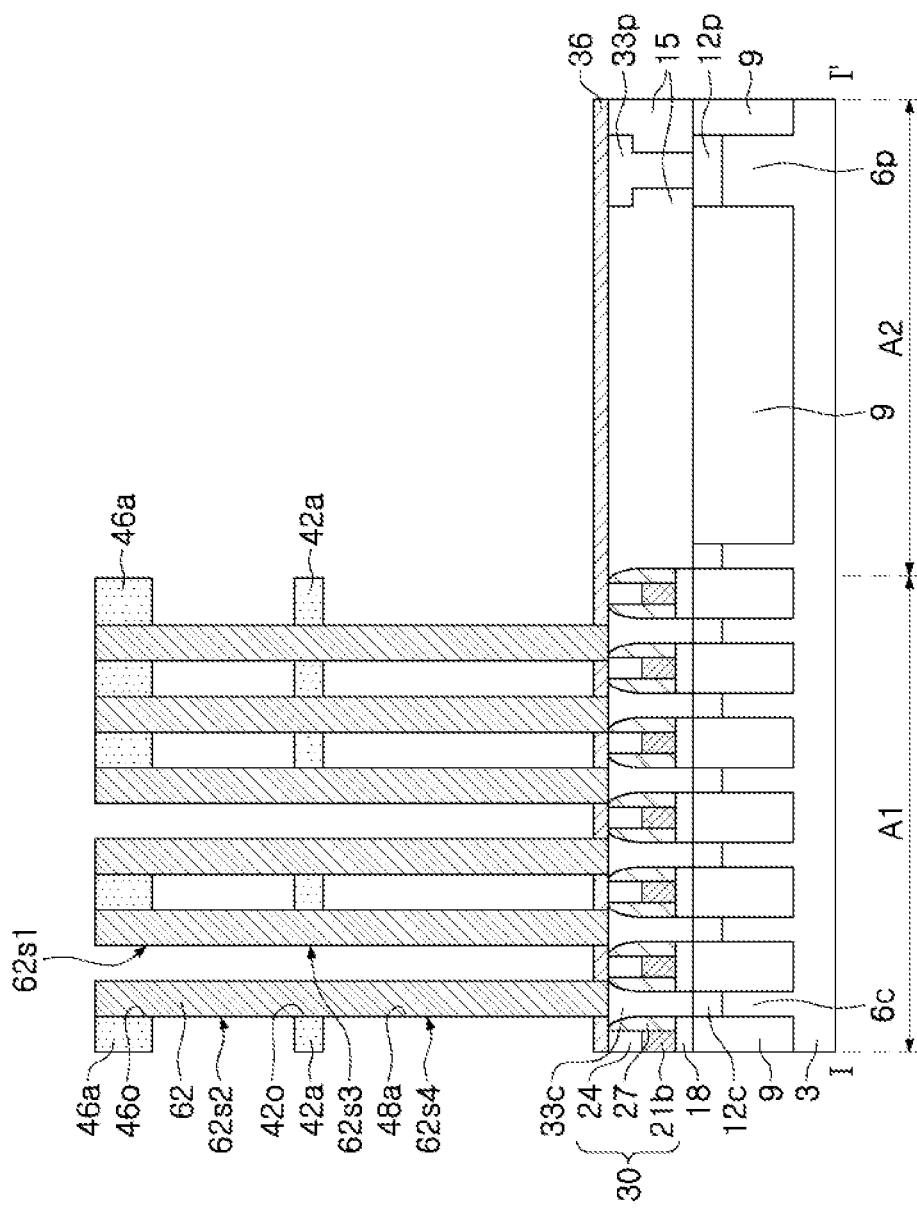

Referring to FIG. 18, the mold structure 48 may be etched by an etching process using the mask 70 as an etching mask. The mask 70 may be removed after the etching of the mold structure 48 or during the etching of the mold structure 48. For example, by using the mask 70 as an etching mask, the upper supporting layer 46 of the mold structure 48 may be etched to form upper support pattern 46a and expose the upper mold layer (44 of FIG. 16). Patterning of the upper support layer 46 may be performed by, for example, a dry etching process, but the present inventive concept is not limited thereto. The upper mold layer 44 may be etched to expose the lower supporting layer (42 of FIG. 16), the lower supporting layer 42 may be etched to form a lower support pattern 42a and expose the lower mold layer (40 of FIG. 16), and the lower mold layer 40 may be etched to remove it.

In an example of the present inventive concept, prior to the etching of the lower supporting layer 42, the upper mold layer 44 may be completely removed by an isotropic etching process. For example, when the upper mold layer 44 is formed of a silicon oxide ($SiO_2$) layer, the upper mold layer 44 may be removed by a wet or dry etching process, using an etchant capable of selectively removing the silicon oxide ($SiO_2$) layer. For example, the etching process may be a wet deep-out process.

In an example of the present inventive concept, the etch stop layer 36 may remain after the lower and upper mold layers 40 and 44 have been removed.

The conductive pillars 62 may include first side surfaces 62s1 exposed by the upper opening 46o of the upper support pattern 46a, second side surfaces 62s2 exposed by removing the upper mold layer 44, third side surfaces 62s3 exposed by the lower opening 42o of the lower support pattern 42a, and fourth side surfaces 62s4 exposed by removing the lower mold layer 40.

Referring to FIG. 4 again, a dielectric layer 80 may be conformally formed on the substrate 3 having the lower and upper support pattern 42a and 46a and the conductive pillars 62, and an electrode layer 82 covering the conductive pillars 62 and the lower and upper support patterns 42a and 46a may be formed on the dielectric layer 80 while filling spaces between the conductive pillars 62.

A planarized intermetal insulating layer 85 may be formed on the substrate 3 having the electrode layer 82. A first contact plug 88c penetrating the intermetal insulating layer 85 and electrically connected to the electrode layer 82 and a second contact plug 88p penetrating the intermetal insulating layer 85 and the etch stop layer 36 and electrically connected to the peripheral contact plug 33p may be formed.

As set forth above, according to an example embodiment of the present inventive concept, since a direction of a stress applied to conductive pillars 62 may be dispersed, the conducive pillars 62 may be prevented from being in contact with each other when depositing a dielectric layer 80 subsequently. Accordingly, the subsequent dielectric layer 80 may be symmetrically and uniformly deposited, thereby providing a semiconductor device which is structurally stable and reliable.

While example embodiments have been shown and described above, it will be apparent to those skilled in the art that modifications and variations could be made without departing from the spirit and scope of the present inventive concept as defined by the appended claims.

What is claimed is:

1. A semiconductor device comprising:
a plurality of lower electrodes repeatedly arranged at a first pitch in a first direction and a second direction crossing the first direction on a substrate; and
a support pattern in contact with sidewalls of the plurality of lower electrodes and supporting the plurality of lower electrodes,
wherein the support pattern includes a first support region having a plurality of openings penetrating the support pattern and a second support region disposed along a periphery of the first support region, and
the plurality of openings continuously extend in a zigzag manner throughout an entirety of the first support region.

2. The semiconductor device of claim 1, wherein the plurality of openings are repeatedly arranged at a second pitch, which is twice the first pitch.

3. The semiconductor device of claim 1, wherein the plurality of openings are in partial contact with sidewalls of all the plurality of lower electrodes in the first support region.

4. The semiconductor device of claim 1, wherein portions in which the plurality of openings are bent are spaced apart from the plurality of lower electrodes.

5. The semiconductor device of claim 1, wherein the plurality of openings are bent at every length corresponding to the first pitch.

6. The semiconductor device of claim 5, wherein an angle at which the plurality of openings are bent is equal to a value obtained by subtracting an acute angle formed by the first direction and the second direction from 180 degrees.

7. The semiconductor device of claim 1, wherein an angle at which the plurality of openings are bent is smaller than a value obtained by subtracting an acute angle formed by the first direction and the second direction from 180 degrees.

8. The semiconductor device of claim 1, wherein the plurality of openings are bent at every N times of the first pitch, and the N is a natural number of 2 or more.

9. The semiconductor device of claim 1, wherein the plurality of openings comprise a first extending portion extending in the first direction and a second extending portion extending in the second direction, and two or more of the plurality of lower electrodes, in contact with the first extending portion and adjacent to each other in the first direction or in contact with the second extending portion and adjacent to each other in the second direction, have contact areas with the support pattern the same as each other.

10. The semiconductor device of claim 1, wherein the plurality of openings comprise a first extending portion and a second extending portion, extending in different directions, and two or more of the plurality of lower electrodes, in contact with the first extending portion and adjacent to each other in the first direction or in contact with the second extending portion and adjacent to each other in the second direction, have contact areas with the support pattern different from each other.

11. A semiconductor device comprising:
a plurality of conductive pillars repeatedly arranged at a first pitch in a first direction and a second direction crossing the first direction at an acute angle on a substrate; and
a support pattern in contact with sidewalls of the plurality of conductive pillars and supporting the plurality of conductive pillars,
wherein the support pattern includes a first support region having a plurality of openings penetrating the support pattern and a second support region disposed along a periphery of the first support region, and
the plurality of openings continuously extend in a zigzag manner throughout an entirety of the first support region, respectively, and are repeatedly arranged at a second pitch, which is twice the first pitch.

12. The semiconductor device of claim 11, wherein the plurality of openings are in partial contact with sidewalls of all the plurality of conductive pillars in the first support region.

13. The semiconductor device of claim 11, wherein portions in which the plurality of openings are bent are spaced apart from the plurality of conductive pillars.

14. The semiconductor device of claim 11, wherein the plurality of openings are bent at every length corresponding to the first pitch.

15. The semiconductor device of claim 14, wherein an angle at which the plurality of openings are bent is equal to a value obtained by subtracting the acute angle formed by the first direction and the second direction from 180 degrees.

16. The semiconductor device of claim 11, wherein an angle at which the plurality of openings are bent is smaller than a value obtained by subtracting the acute angle formed by the first direction and the second direction from 180 degrees.

17. The semiconductor device of claim 11, wherein the plurality of openings are bent at every N times of the first pitch, and the N is a natural number of 2 or more.

18. The semiconductor device of claim 11, wherein the plurality of openings comprise a first extending portion extending in the first direction and a second extending portion extending in the second direction, and two or more of the plurality of conductive pillars, in contact with the first extending portion and adjacent to each other in the first direction or in contact with the second extending portion and adjacent to each other in the second direction, have contact areas with the support pattern the same as each other.

19. The semiconductor device of claim 11, wherein the plurality of openings comprise a first extending portion and a second extending portion, extending in different directions, and two or more of the plurality of conductive pillars, in contact with the first extending portion or the second extending portion and adjacent to each other in the first direction or the second direction, have contact areas with the support pattern different from each other.

20. A semiconductor device, comprising:
a plurality of conductive pillars repeatedly arranged in a first direction and a second direction crossing the first direction at an acute angle on a substrate; and
a support pattern in contact with sidewalls of the plurality of conductive pillars and supporting the plurality of conductive pillars,
wherein the support pattern includes a first support region having a plurality of openings penetrating the support pattern and a second support region disposed along a periphery of the first support region,
the plurality of openings continuously extend throughout an entirety of the first support region, and include a first extending portion and a second extending portion extending in different directions and alternately arranged, and
a portion in which the first extending portion and the second extending portion meet each other is spaced apart from the plurality of conductive pillars.

* * * * *